United States Patent [19]
Reczek et al.

[11] Patent Number: 5,126,816
[45] Date of Patent: Jun. 30, 1992

[54] INTEGRATED CIRCUIT WITH ANTI LATCH-UP CIRCUIT IN COMPLEMENTARY MOS CIRCUIT TECHNOLOGY

[75] Inventors: Werner Reczek, Munich; Josef Winnerl, Landshut; Wolfgang Pribyl, Ottobrunn, all of Fed. Rep. of Germany

[73] Assignee: Siemens Aktiengesellschaft, Berlin and Munich, Fed. Rep. of Germany

[21] Appl. No.: 774,733

[22] Filed: Oct. 10, 1991

Related U.S. Application Data

[63] Continuation of Ser. No. 477,928, filed as PCT/DE88/00648, Oct. 24, 1988, abandoned.

[30] Foreign Application Priority Data

Dec. 23, 1987 [DE] Fed. Rep. of Germany ....... 3743931
Jun. 27, 1988 [DE] Fed. Rep. of Germany ....... 3821644

[51] Int. Cl.⁵ ..................... H01L 27/02; H01L 29/48
[52] U.S. Cl. ....................... 357/42; 357/41; 357/15
[58] Field of Search .......... 357/42, 41, 15, 59; 307/296.2, 296.8

[56] References Cited

FOREIGN PATENT DOCUMENTS

0084000A3  1/1983  European Pat. Off.
0198569A1  1/1986  European Pat. Off.
60-117654  6/1985  Japan ...................................... 357/42

OTHER PUBLICATIONS

"Integrierte MOS Schaltungen", Healbleiterelektronik 14, H. Weiss, pp. 109–112, 1982.
"Static & Transient Latch-UP Hardness in N-Well CMOS with On-Chip Substrate Bias Generator", IEDM85, Technical Digest, D. Takacs, 1985, pp. 504–508.
"A VLSI Suitable Schottky-Barrier CMOS Process", S. E. Swirhun et al., IEEE Transaction on Electron Devices, vol. ED-32, No. 2, Feb. 1985, pp. 194–202.
Lin et al., "Shielded Silicon Gate Complementary MOS Integrated Circuit," IEEE Transactions on Electron Devices, vol. Ed. 19, No. 11, Nov. 1972, pp. 1199–1206.
Dingwall, "Improved COS/MOS Inverter Circuit for Reducing Burn-out and Latch-up," RCA Technical Notes, TN No. 1230, Jul. 1979, pp. 1–4.
E. E. Moore, "Performance Characteristics of RCA's Low-Voltage COS/MOS Devices," Advances in MOS Technology-Session 4B, Paper 4B.3, 1971, pp. 188–189.

Primary Examiner—Mark Prenty
Attorney, Agent, or Firm—Hill, Van Santen, Steadman & Simpson

[57] ABSTRACT

Integrated circuit having anti latch-up circuit in complementary MOS circuit technology. Due to the incorporation of non-linear elements between the ground ($V_{SS}$) and the p-conductive semiconductor substrate ($P_{sub}$) and between the supply voltage ($V_{DD}$) and the n-conductive semiconductor zone ($N_w$), the risk of the occurrence of the latch-up effect triggered by the build-up of base charges at the parasitic vertical and lateral bipolar transistors is diminished. The space requirement for the non-linear elements to be additionally incorporated is low and the circuit properties of the MOS transistors are not influenced as a result thereof. The realization of the non-linear elements can ensue with Schottky contacts or with additional MOS transistors that are wired as diode elements. A realization in the form of buried diodes of polycrystalline silicon (PSi) is also possible, realized, for example, as barrier layer diodes.

29 Claims, 3 Drawing Sheets

INTEGRATED CIRCUIT WITH ANTI LATCH-UP CIRCUIT IN COMPLEMENTARY MOS CIRCUIT TECHNOLOGY

This is a continuation of application Ser. No. 477,928, filed as PCT/DE88/00648, Oct. 24, 1988, now abandoned.

BACKGROUND OF THE INVENTION

The invention is directed to an integrated circuit having an anti latch-up circuit in complementary MOS circuit technology conforming to the preamble of patent claim 1.

In integrated circuits of this species in complementary MOS technology, parasitic pnpn paths between the supply voltage ($V_{DD}$) and the ground ($V_{SS}$) occur that are similar to a thyristor. This parasitic four-layer structure can be triggered by disturbances, for example by current pulses or by over-shoots or under-shoots of the applied supply voltage at the semiconductor layers. The change from the normal condition into a highly conductive condition, i.e. the triggering of this four-layer structure, is referred to as latch-up.

For understanding the latch-up effect, it can be assumed that four successive semiconductor layers of alternating conductivities are generally present between a terminal of a field effect transistor of the first channel type lying in a well-shaped semiconductor zone and a terminal of a field effect transistor of the second channel type placed outside of this zone on the semiconductor substrate, whereby the one terminal region of the former transistor forms the first semiconductor layer, the well-shaped semiconductor zone forms the second semiconductor layer, the semiconductor substrate forms the third semiconductor layer and the one terminal region of the latter transistor forms the fourth semiconductor layer. A parasitic, bipolar pnp transistor and an npn transistor derive due to this structure. The collector of the pnp transistor corresponds to the base of the npn transistor and the base of the pnp transistor corresponds to the collector of the npn transistor. This structure forms a four-layer diode having the layer sequence pnpn as in a thyristor. Given a positive bias of the semiconductor substrate, the pn-junction between the third and fourth semiconductor layers can be biased to such an extent in conducting direction that a current path that is to be attributed to a parasitic thyristor effect within this four-layer structure arises between the said transistor terminals. The current path then continues to be present after a dismantlying of the positive substrate bias and can thermally overload the integrated circuit.

The latch-up effect is described in the textbook Halbleiterelektronik 14, H. Weiss, K. Horninger, "Integrierte MOS-Schaltungen", pages 109–112. A modification of the technology (doping profiles) or measures in the design (well spacings) are proposed here as alleviation. Another solution for suppressing the latch-up effect triggered by substrate/shift currents (for example, upon turn-on) is presented in the publication by D. Takacs et al, "Static and transient latch-up hardness in n-well CMOS with on-chip substrate bias generator", IEDM 85, Technical Digest, pages 504–508. A clamp circuit is proposed therein that prevents a latch-up effect in that the semiconductor substrate potential is limited to a value that is not adequate for activating the parasitic bipolar transistors in the semiconductor substrate. To that end, the clamp circuit must carry the high capacitative charging currents off to ground.

Another possibility of suppressing the latch-up effect produced by over-shoots/under-shoots at the input/output terminals lies in the employment of Schottky contacts that are wired between the source/drain terminals of the field effect transistors and the semiconductor substrate or the well-shaped semiconductor zone. Such an arrangement may be derived from FIGS. 2 and 3 in the publication, IEEE Transaction on Electron Devices, Vol. ED-32, No. 2, February 1985, pages 194–202, "A VLSI Suitable Schottky-Barrier CMOS Process" by S. E. Swirhun et al. FIG. 2A thereby shows an inverter that is equipped with Schottky contacts in an n-shaped semiconductor zone, these Schottky contacts being fashioned of platinum-silicon (PtSi) at the source and drain terminals of a MOS transistor. FIG. 3A of the above-recited publication shows buried Schottky contacts at the source and drain terminals of a MOS transistor as well in a well-shaped semiconductor zone. These contacts are arranged such that they form an ohmic contact in lateral direction and form a Schottky contact for the current flow in vertical direction.

A deterioration of the MOS transistor parameters and Schottky stray currents can arise due to the introduction of the Schottky contacts as proposed in the publication of IEEE Transactions. Moreover, the introduction of these Schottky contacts requires an involved process management. The possibility of the positive charging of the semiconductor substrate is not fundamentally excluded by a clamp circuit as recited in the publication of D. Takacs et al; rather, the influences thereof are merely compensated in that a low-impedance ground connection in turn dismantles the positive charging in case a positive charging of the semiconductor substrate has occurred.

SUMMARY OF THE INVENTION

The object of the invention is to specify a circuit of the species initially cited wherein the appearance of latch-up effects is largely avoided. This is inventively achieved by a fashioning of the circuit conforming to the characterizing part of patent claim 1.

Patent claims 2 through 13 are directed to preferred developments and improvements of the invention. The advantage obtainable with the invention is particularly comprised therein that the switch properties of the MOS transistors are not influenced by the circuit of the invention. Further, the space requirement for the circuit of the invention is extremely low since only a low number of circuit elements, is required for it.

BRIEF DESCRIPTION OF THE DRAWINGS

Exemplary embodiments of the invention are shown in FIGS. 3 through 6. They shall be set forth in greater detail below. Shown are.

DESCRIPTION OF THE PREFERRED EMBODIMENT

Figure 1:
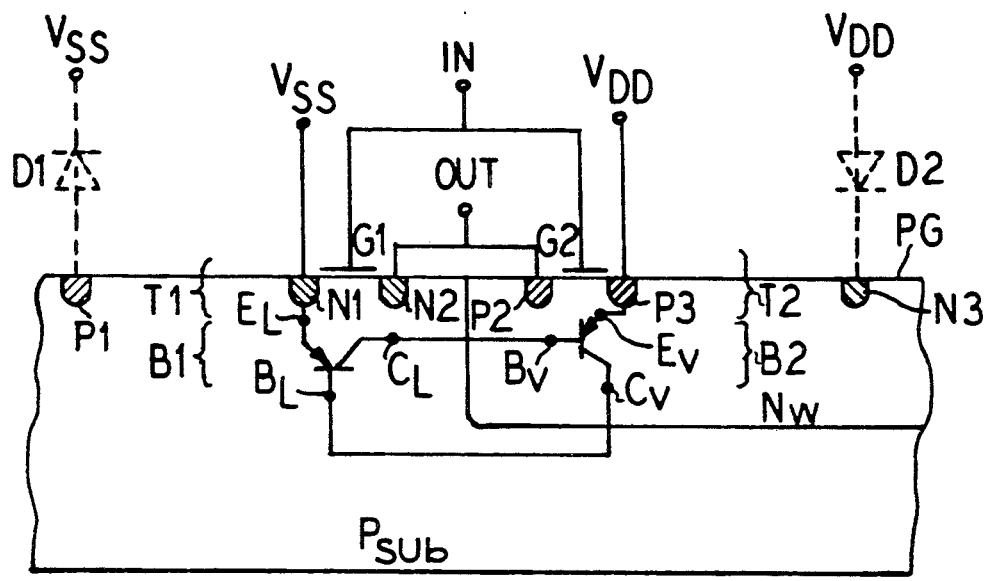
FIG. 1 a cross section through a CMOS inverter, whereby the parasitic, lateral and vertical bipolar transistors are also entered that can lead to latch-up effects; the semiconductor substrate and the well-shaped semiconductor zone are thereby connected to the ground $V_{SS}$ and to the supply voltage $V_{DD}$ via two non-linear elements.

FIG. 1 schematically shows an integrated circuit of the invention having an anti latch-up circuit, this being constructed on a semiconductor substrate $P_{sub}$ of doped semiconductor material, for example p-conductive silicon. The semiconductor substrate $P_{sub}$ has an n-conductive, well-shaped semiconductor zone $N_w$ that extends up to the boundary surface $P_g$. n+-doped semiconductor regions N1, N2 that form the source and drain region of an n-channel field effect transistor T1 are inserted into the semiconductor substrate outside of the semiconductor zone $N_w$, whereas two p+-doped semiconductor regions P2, P3 that represent the drain and source region of a p-channel field effect transistor T2 are present inside the well-shaped semiconductor zone $N_w$. In the recited example of FIG. 1, the transistors T1 and T2 are wired as a CMOS inverter stage, whereby the n+-doped semiconductor region N1 is connected to ground $V_{ss}$ and is the source terminal of the n-channel field effect transistor T1 and the n+-doped semiconductor region N2 forms the output OUT of the CMOS inverter stage as drain terminal of the n-channel field effect transistor T1. The p+-doped semiconductor region P2 is likewise applied to the output OUT and forms the drain terminal of the p-channel field effect transistor T2, whereas the p+-doped semiconductor region P3 is wired to the supply voltage $V_{DD}$ as source terminal of the same field effect transistor. An input signal for the CMOS inverter stage is forwarded via the input IN to a first and second gate region G1, G2 of the first or, respectively, second field effect transistor T1, T2, whereas an output signal can be taken at the output OUT.

The parasitic bipolar transistors B1 and B2 are also shown, these both being of significance for the latch-up effect. The collector $C_L$ of the lateral npn bipolar transistor B1 is connected to the base $B_v$ of the vertical pnp bipolar transistor B2; the base terminal $B_L$ of the lateral bipolar transistor B1 is connected to the collector terminal $C_v$ of the bipolar transistor B2. Further, the emitter $E_L$ of the bipolar transistor B1 is wired to the source terminal N1 of the field effect transistor T1 and the emitter $E_v$ of the bipolar transistor B2 is wired to the source terminal of the field effect transistor T2. The parasitic bipolar transistors form a four-layer diode pnpn, comparable to a thyristor. When, due to specific signals, the emitter-base diode between the emitter $E_v$ and the base $B_v$ of the lateral bipolar transistor is polarized in conducting direction, then the thyristor can trigger. Such a high current then flows over the pn-junctions that either the junctions or the leads fuse, this potentially leading to a destruction of the CMOS inverter stage.

The part of the CMOS inverter stage critical to the invention is represented by the incorporation of the non-linear elements D1, D2, for example elements having a diode characteristic. The first non-linear element is thereby connected between a p+-doped semiconductor region P1 and the ground $V_{ss}$, whereas the second non-linear element is arranged between an n+-doped semiconductor region N3 and the supply voltage $V_{DD}$. The p+-doped semiconductor region P1 is thereby arranged within the semiconductor substrate $P_{sub}$ and the n+-doped semiconductor region N3 is arranged within the well-shaped semiconductor zone $N_w$. The interconnection of the non-linear elements D1, D2 for p-conductive, well-shaped semiconductor zones ensues analogously to the terminal of the ground $V_{ss}$ and of the supply voltage $V_{DD}$ are thereby merely to be interchanged. The non-linear element D1 first effects that majority charge carriers that represent a hole current can be carried off to ground $V_{ss}$ in low-impedance fashion and, second, prevents that the base charge of the parasitic lateral bipolar transistor B1 can be built-up at the base $B_L$ via a substrate contact (not shown). In this case, the semiconductor substrate is connected to the ground $V_{ss}$ in low-impedance fashion via the non-linear element D1. The build-up of a base charge of the lateral bipolar transistor B1 is now only defined by a low inhibit current of the non-linear element D1. This applies analogously to the non-linear element D2 that is connected between the n-conductive, well-shaped semiconductor zone $N_w$ and the supply voltage $V_{DD}$. This measure prevents the pn-junctions of the parasitic bipolar transistors B1 and B2 from being polarized in conducting direction, this denoting a reduction of the latch-up risk.

The behavior of the overall CMOS circuit upon turn-on is not deteriorated due to the incorporation of the non-linear elements D1 and D2, whereas the risk of a latch-up during operation is diminished by the non-linear elements D1 and D2 even given the presence of noise pulses at n+-doped semiconductor regions N1, at the p+-doped semiconductor regions P3 and at the post OUT. What is thereby important is that the non-linear elements D1, D2 have a conducting-state voltage that is lower than the conducting-state voltage of the pn-junctions of the parasitic bipolar transistor B1 and B2.

Figure 2:
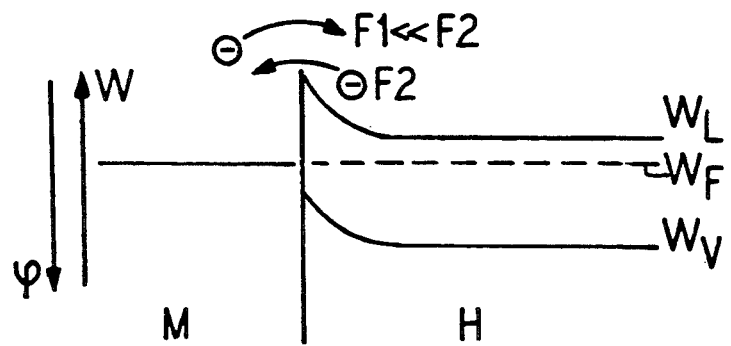
FIG. 2 an energy band diagram for a metal-n+-semiconductor junction that forms a Schottky contact.

The non-linear elements D1, D2 can be realized with the assistance of what are referred to as Schottky contacts. With respect thereto, FIG. 2 shows an energy band diagram in the energy-location diagram for a Schottky contact that is composed of a metal M and of n+-semiconductor H. For a quantitative statement about the energy W as well as about the potential 6, these are entered as ordinate axes in the left-hand part of FIG. 2. The Fermi level $W_F$ is entered both in the n-semiconductor region H as well as in the metal region M and indicates the energy value in the energy band diagram at which the mean occupation number with electrons amounts to 50% of the maximum value. The energy levels of the conduction band $W_L$ as well as of the valency band $W_v$ are also entered for the n+-semiconductor H, whereby the energy level of the conduction band $W_L$ lies above the Fermi energy level and is more weakly occupied with electrons, whereas the energy level of the valency band $W_v$ is arranged under the Fermi energy level and is more highly occupied with electrons. When the electron affinity for electrons from the metal is greater than the electron affinity from the semiconductor material, electrons from the n+-semiconductor proceed into the metal given a contacting between the n+-conductive semiconductor material and the metal. In thermal equilibrium, the Fermi energies of metal and semiconductor then proceed at the same level as a common electro-chemical potential. The electrons that have migrated from the semiconductor thereby lead to a positive space charge in the n+-semiconductor and lead to a corresponding, negative surface charge on the metal surface. Due to the different electron affinities, electrons proceed more easily from the n+-semiconductor material H into the metal M than vice versa. This is shown in FIG. 2 with arrows $F_1$ and $F_2$, whereby the electron flow from the metal M to the n+-semiconductor H is referenced $F_1$ and the electron flow from the n+-semiconductor material to the metal M is referenced with $F_2$. The electron flow $F_1$ is far lower than the electron flow $F_2$. A critical feature of a Schottky contact compared to a pn-junction lies in the fact that, by contrast thereto, only majority carriers in one direction define the current transport. The lacking minority carriers prevent the negative influence of a p+n-diode to latch-up. This is analogously valid for a junction between metal and p+-semiconductor. A critical advantage of the realization of non-linear elements with Schottky contacts lies therein that, given under-shootings and over-shootings, the diodes D1 or, respectively, D2 prevent an injection of the p+-doped semiconductor region into the well-shaped semiconductor zone and of the n+-doped semiconductor region into the semiconductor substrate and therein that these contacts have a lower conducting-state voltage compared to normal pn-junctions. As a result thereof, the pn-junctions of the parasitic bipolar transistors B1 and B2 are relieved and the risk of a latch-up is largely prevented. Since the current transport given Schottky contacts is predominantly defined by majority carriers in one direction, a slight proportion of minority carriers likewise contributes to reducing the latch-up risk in that a build-up of base charges at the remaining parasitic bipolar transistors is suppressed.

Figure 3:
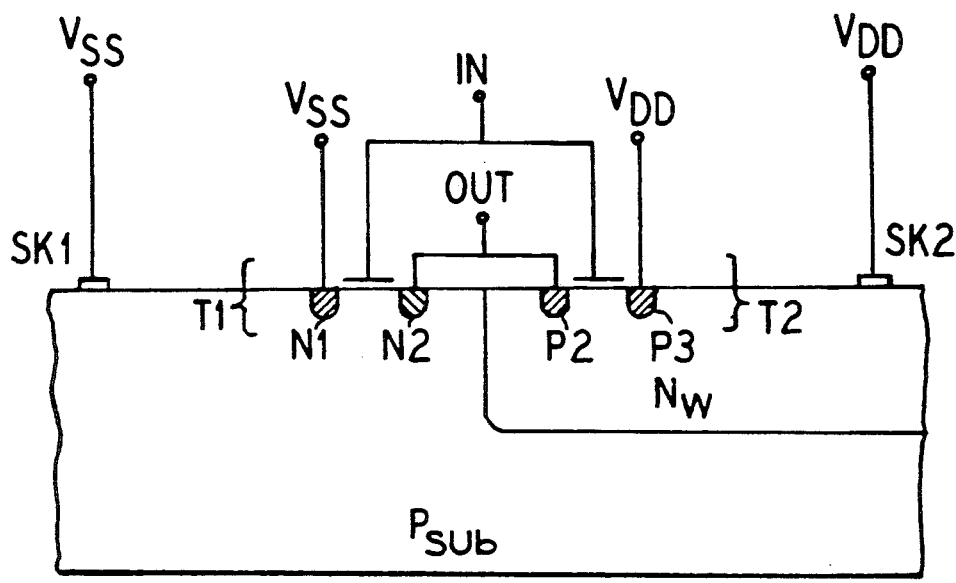
FIG. 3 a cross section through a further CMOS inverter wherein the ohmic well and substrate contacts were replaced by Schottky contacts.

FIG. 3 shows the cross section through a CMOS inverter circuit, whereby ohmic well and substrate contacts have been replaced by two Schottky contacts SK1 and SK2. Analogous to FIG. 1, a well-shaped, n-conductive semiconductor zone $N_w$ is arranged within the p-conductive semiconductor substrate $P_{sub}$. The CMOS inverter circuit is again formed of two MOS transistors, of an n-channel field effect transistor T1 and of a p-channel field effect transistor T2. The interconnection of the two field effect transistors ensues analogously to that in FIG. 1, so that the same reference characters have likewise been employed in FIG. 3. The two non-linear elements D1 and D2 of FIG. 1 are realized in FIG. 3 with the Schottky contacts SK1 and SK2. Whereas the first Schottky contact SK1 is connected between the ground $V_{ss}$ and the p-conductive semiconductor substrate $P_{sub}$, the second Schottky contact SK2 is arranged between the supply voltage $V_{DD}$ and the n-conductive semiconductor zone $N_w$. When the p-conductive semiconductor substrate $P_{sub}$ is positively charged in comparison to the ground $V_{ss}$ and when this voltage difference is greater than the conducting-state voltage of the first Schottky contact SK1, majority carriers that form a hole current can flow off from the p-conductive semiconductor substrate $P_{sub}$ to ground $V_{ss}$; conversely, however, only a slight number of positive space charges are injected from the metal terminal of the first Schottky contact SKI into the positive semiconductor substrate $P_{sub}$. The buildup of a base charge at the parasitic, lateral bipolar transistor B1 is thus prevented. When, on the other hand, the n-conductive semiconductor zone $N_w$ is negatively charged compared to the supply voltage $V_{DD}$ and when this voltage difference exceeds the conducting-state voltage of the second Schottky contact SK2, then electrons can flow off from the n-conductive semiconductor zone $N_w$ via the second Schottky contact SK2. Conversely, however, electrons can hardly be injected from the metal terminal of the second Schottky contact SK2 into the n-conductive semiconductor zone $N_w$. As a result thereof, the build-up of a base charge at the parasitic, vertical bipolar transistor B2 is prevented.

It is likewise possible to fashion the two metal terminals of the first and second Schottky contact into two double contacts. In this case, the metal terminal of the first Schottky contact SK1 covers parts both of the p-doped semiconductor substrate $P_{sub}$ as well as of the source terminal N1 of the MOS transistor T1, whereas the metal terminal of the second Schottky contact SK2 covers parts of the n-conductive semiconductor zone $N_w$ and the source terminal P3 of the p-channel MOS transistor T2. In contrast to Schottky source-drain regions as recited in the publication of S. E. Swirhun et al, "A VLSI Suitable Schottky Barrier CMOS Process", in IEEE Transaction on Electron Devices, Vol. ED 32, No. 2, February 1985, pages 194–202, the inhibit currents of the Schottky contacts SK1 and SK2 do not represent any influencing of the switching properties of the MOS transistors. As a result, circuit behavior is also not influenced.

Figure 4:
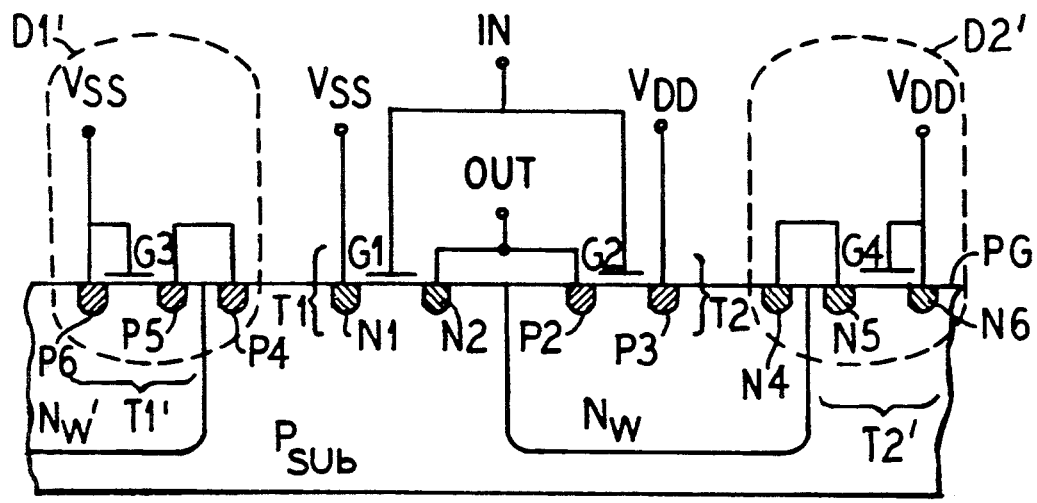
FIG. 4 a further cross section through a CMOS inverter circuit whereby the semiconductor substrate and the well-shaped semiconductor zone are wired as diode elements via MOS transistors and are connected to the ground $V_{ss}$ and to the supply voltage $V_{DD}$.

FIG. 4 shows a further cross section through a CMOS inverter circuit. The p-conductive semiconductor substrate $P_{sub}$ is connected to the ground $V_{ss}$ via a first, additional MOS transistor T1' that is wired as a diode element and the n-conductive, well-shaped semiconductor zone $N_w$ is connected to the supply voltage $V_{DD}$ via a second, additional MOS transistor T2' wired as a diode element. In addition to the n-conductive, well-shaped semiconductor $N_w$ a further n-conductive semiconductor zone $N_{w'}$ is arranged in the p-conductive semiconductor substrate $P_{sub}$, whereby both n-conductive semiconductor zones extend up to a boundary surface PG. The p-conductive semiconductor substrate $P_{sub}$ continues to contain two n+-doped semiconductor regions N1 and N2 that form the n-channel field effect transistor T1 together with the gate region G1, whereas the n-conductive, well-shaped semiconductor zone $N_w$ comprises two p+-doped semiconductor regions P2 and P3 that, together with the gate region G2, represent the p-channel field effect transistor T2. The inverter circuit of FIG. 4 is constructed analogous to that in FIG. 1, so that the n+-doped semiconductor region N1 is connected to ground $V_{ss}$ and is the source terminal of the field effect transistor T1 and the n+-doped semiconductor region N2 forms the output OUT of the inverter stage as drain terminal of the field effect transistor T1. Further, the p+-doped semiconductor region P2 is likewise connected to the output OUT and forms the drain terminal of the p-channel field effect transistor T2, whereas the p+-doped semiconductor region P3 is wired to the supply voltage $V_{DD}$ as source terminal of the same field effect transistor. The input signals for the inverter stage are applied to the input IN and output signals can be taken at the output OUT.

The realization of the non-linear elements with additional MOS transistors is especially suited for latch-up-proof output stages for which no Schottky contacts are provided in the manufacturing process employed. The additional requirements for space that arise are thereby slight. The first additional MOS transistor T1' is constructed of p-conductive semiconductor regions P6 and P5 as well as of a gate region G3, whereby the p-conductive semiconductor regions P6 and P5 are arranged with the further n-conductive semiconductor zone $N_{w'}$, and the p-conductive semiconductor zone P5 is connected to a further p-conductive semiconductor zone P4 that is situated within the p-conductive semiconductor substrate $P_{sub}$. The drain terminal of the first additional MOS transistor T1' that is formed of the p+-doped semiconductor region P6 and the gate region G3 are connected to the ground $V_{ss}$ in common. The second additional MOS transistor T2' contains two n+-doped semiconductor regions N5 and N6 both of which are arranged within the p-conductive semiconductor substrate $P_{sub}$, and also contains a gate region G4. The gate region G4 as well as the n+-doped semiconductor region N6 which represents the drain terminal of the second additional MOS transistor T2' are thereby connected in common to the supply voltage $V_{DD}$. The n+-doped semiconductor region N5 that forms the source terminal of the second additional MOS transistor T2 is connected to a further n+-doped semiconductor region N4 that is situated within the n-conductive, well-shaped semiconductor zone $N_w$.

In common with the further p+-doped semiconductor region P4, th first additional MOS transistor T1' forms a diode element D1' that is connected between the ground $V_{ss}$ and the p+-doped semiconductor region P4. Due to the connection of the n+-doped semiconductor region N5 to the n+-doped semiconductor region N4 and due to the common interconnection of the gate terminal G4 with the n+-doped semiconductor region N6 to the supply voltage Vhd DD, the second additional MOS transistor T2' is wired as a further diode element D2' that is arranged between the supply voltage $V_{DD}$ and the n+-doped semiconductor region N4. The diode element D1' that is arranged between the ground $V_{ss}$ and the p-conductive substrate $P_{sub}$ is realized by a p-conductive MOS transistor T1', as may be seen from FIG. 4, whereas the diode element D2' that is arranged between the supply voltage $V_{DD}$ and the n-conductive, well-shaped semiconductor zone $N_w$ is constructed with the assistance of an n-conductive MOS transistor T2'. The functioning of the circuit recited in FIG. 4 is identical to the functioning of the circuit of FIG. 3. As soon as the voltage difference between the p-conductive semiconductor substrate $P_{sub}$ and the ground $V_{ss}$ exceeds the conducting-state voltage of the diode element D1', the latter becomes conductive and as soon as a voltage difference appears at the diode element D2' between the supply voltage $V_{DD}$ and the n-conductive semiconductor zone $N_w$ that is greater than the conducting-state voltage of the same diode element, the diode element D2' switches into its conductive condition. These measures can prevent the base charges of the lateral and vertical bipolar transistors (not shown here) from being built-up. The latch-up risk is thus noticeably reduced.

In addition to the embodiments discussed above, the invention also covers embodiments wherein n-conductive substrates are provided with p-conductive, well-shaped semiconductor zones. The conductivity types of all semiconductor parts and the polarities of all voltages are thereby replaced by their respective opposites. Likewise, the first non-linear element can be connected between a p+-doped semiconductor region P1 and negative substrate potential ($V_{BB} < V_{ss}$), whereas the second non-linear element can be connected between an n+-doped semiconductor region N3 and positive well potential ($V_{well} > V_{Dd}$).

Figure 5:
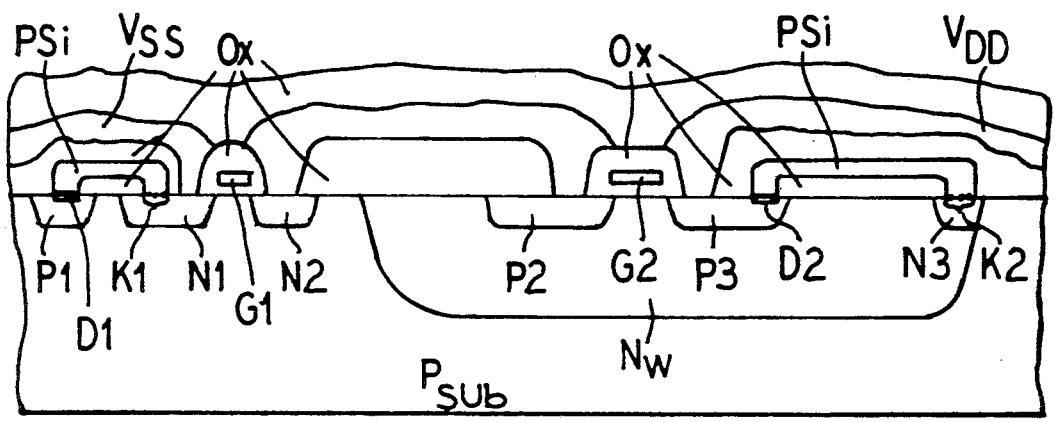
FIG. 5 a cross section that is not true-to-scale through a further embodiment of the circuit of the invention.
Figure 6:
FIG. 6 the appertaining, symbolic circuit diagram.

FIG. 5 shows a further, advantageous embodiment of the invention in a cross section that is not true to scale. In cross section, it shows two MOS transistors T1, T2 of mutually complementary conductivity type connected in series with one another. The appertaining symbolic circuit diagram is shown in FIG. 6. The transistor T1 is of the NMOS type. The transistor T2 is of the PMOS type. The transistor T1 is arranged in the p-conductive substrate $P_{sub}$. The transistor T2 is arranged in an n-conductive, well-shaped semiconductor zone $N_w$. The diffusion regions for source and drain that are standard in MOS transistors are referenced N1 and N2 or, respectively, P3 and P2. The substrate $P_{sub}$ contains a more highly doped semiconductor region P1 of the same conductivity type as the substrate itself. Correspondingly, the well-shaped semiconductor zone $N_w$ contains a more highly doped semiconductor region N3 of the same conductivity type as the semiconductor zone itself. Such more highly doped semiconductor regions are universally employed in CMOS technology. The gates of the transistors are referenced G1 and G2.

In addition to the gates G1, G2, electrical interconnects for supplying ground $V_{ss}$ and supply potential $V_{DD}$ as well as an electrically conductive connection (for example, of aluminum) between the drains N2, P2 of the two transistors T1, T2 are arranged above the substrate $P_{sub}$ and above the well-shaped semiconductor zone $N_w$. For example, it can serve as output OUT of a CMOS inverter formed of the two transistors T1, T2. The various, electrically conductive regions above substrate $P_{sub}$ and well-shaped semiconductor zone $N_w$ as is universally standard, are electrically separated from one another by oxides Ox or by other insulating layers (for example, nitride). The uppermost oxide layer can thereby be fashioned as a passivation layer.

The non-linear elements D1, D2 are realized as buried diodes in this embodiment. To that end, a respective, electrically conductive layer that essentially contains doped polycrystalline silicon PSi is provided within those oxide layers Ox that at least partially cover the diffusion regions N1, P3 (sources) of the transistors T1, T2 and the more highly doped semiconductor regions P1, N3. Dependent on the technology employed (N-well process, P-well process, as well as N and P-well process for the transistors T1 and T2), the conductivity type of the polycrystalline silicon layer PSi is either opposite the conductivity type of the substrate $P_{sub}$ and/or opposite the (one) well-shaped semiconductor zone $N_w$ or, respectively, the well-shaped semiconductor zones (a plurality of mutually opposite conductivity type).

The non-linear elements D1, D2 are fashioned as barrier layer diodes. Their first terminal that is respectively essentially composed of the polycrystalline silicone layer PSi is thereby connected to grounded potential $V_{ss}$ via ohmic contacts K1, K2 (connection either via the source-diffusion region N1 or directly with the interconnect) or, respectively, is connected to the more highly doped semiconductor region N3 that is of the same conductivity type as the polycrystalline silicon PSi.

Correspondingly, the second terminals of the non-linear elements D1, D2 are connected to the more highly doped semiconductor region P1 (this, of course, is of the conductivity type opposite that of the polycrystalline silicon layer PSi) or, respectively, is connected via the source-diffusion region P3 to the supply potential $V_{Dd}$. The barrier layer diodes are formed in this way in the region of these connections.

The embodiment has the following advantages:

Polycrystalline silicon layers are already deposited in standard CMOS processes. The only thing that thus has to be provided is a mask modification; no other additional process steps, however, arise.

When the above-described Schottky contacts can not be generated, for example for reasons that lie in an employed, specific manufacturing process, then the present embodiment offers an elegant alternative.

Further, no additional space requirement is necessary since the more highly doped semiconductor regions P1 and N3 are already present in a standard CMOS design, for example in the form of what are referred to as guard rings, and since the space requirement for the polycrystalline silicon PSi generally displaces no other circuit parts. Further, the power yield in this embodiment is higher than in the embodiments set forth above, this leading to an even greater protection against the feared latch-up effect.

We claim:

1. Integrated circuit having an anti-latch-up circuit in complementary MOS circuit technology having a doped semiconductor substrate of a first conductivity type containing a field effect transistor of a first channel type with a source terminal directly connected to ground and having a well-shaped semiconductor zone of a second conductivity type inserted in the doped semiconductor substrate containing a field effect transistor of a second channel type with a source terminal directly connected to a supply voltage, comprising the anti latch-up circuit containing first and second non-linear elements and the first non-linear element having a first terminal connected to ground and having a second terminal connected to the doped semiconductor substrate of a first conductivity type and the second non-linear element having a first terminal connected to the supply voltage and having a second terminal connected to the inserted, well-shaped semiconductor zone of a second conductivity type, the first and second non-linear elements respectively operationally coupled to the semiconductor substrate and to the well-shaped semiconductor zone.

2. Integrated circuit having an anti-latch-up circuit in complementary MOS circuit technology having a well-shaped semiconductor zone of a first conductivity type inserted into a semiconductor substrate of a second conductivity, and also having a field effect transistor of a first channel type with a source terminal directly connected to ground and arranged within the well-shaped semiconductor zone of a first conductivity type and having a field effect transistor of a second channel type with a source terminal directly connected to a supply voltage and arranged within the semiconductor substrate of a second conductivity type, comprising the anti latch-up circuit containing first and second non-linear elements and the first non-linear element having a first terminal connected to ground and having a second terminal connected to the well-shaped semiconductor zone of a first conductivity type, and the second non-linear element having a first terminal connected to the supply voltage and having a second terminal connected to the doped semiconductor substrate of a second conductivity type, the first and second non-linear elements respectively operationally coupled to the semiconductor substrate and to the well-shaped semiconductor zone.

3. Integrated circuit according to claim 1, wherein the first terminal of the first non-linear element is replaced by a terminal at negative substrate potential and wherein the first terminal of the second non-linear element is replaced by a terminal having more positive potential than the supply voltage.

4. Integrated circuit according to claim 1, wherein the non-linear elements are fashioned as Schottky contacts.

5. Integrated circuit according to claim 4, wherein a metal contact of the Schottky contact of the first non-linear element covers the source terminal of the field effect transistor of the first channel type and covers the doped semiconductor substrate of a first conductivity type and forms a first double contact; and wherein a metal contact of the Schottky contact of the second non-linear element covers the source terminal of the field effect transistor of the second channel type and covers the well-shaped semiconductor zone of a second channel type and forms a second double contact.

6. Integrated circuit according to claim 1, wherein the non-linear elements are realized by MOS transistors that are connected as diode elements.

7. Integrated circuit according to claim 6, wherein a first MOS transistor of a first channel type is arranged within an inserted, further well-shaped semiconductor zone of a second conductivity type; wherein a first terminal of the first MOS transistor and a second terminal of the first MOS transistor is connected to the doped semiconductor substrate of a first conductivity type; wherein a second MOS transistor of a second channel type is arranged within the doped semiconductor substrate of a first conductivity type; wherein a first terminal of the second MOS transistor is connected to a gate of the second MOS transistor and a second terminal of the second MOS transistor is connected to the inserted, well-shaped semiconductor zone of a second conductivity type.

8. Integrated circuit according to claim 1, wherein the non-linear elements are realized in the form of buried diodes.

9. Integrated circuit according to claim 8, wherein the non-linear elements contain essentially doped polycrystalline silicon of the conductivity type opposite that of the substrate.

10. Integrated circuit according to claim 8, wherein the non-linear elements contain essentially polycrystalline silicon of the conductivity type opposite that of the well-shaped semiconductor zone.

11. Integrated circuit according to claim 8, wherein the non-linear elements are fashioned as barrier layer diodes.

12. Integrated circuit according to claim 8, wherein the first terminals of the non-linear elements are connected via ohmic contacts to ground.

13. Integrated circuit according to claim 11, wherein the second terminals of the barrier layer diodes are connected to a more highly doped semiconductor region of the same conductivity type as the polycrystalline silicon.

14. Integrated circuit according to claim 2, wherein the first terminal of the first non-linear element is replaced by a terminal at negative substrate potential and wherein the first terminal of the second non-linear element is replaced by a terminal having more positive potential than the supply potential.

15. Integrated circuit according to claim 2, wherein the non-linear elements are fashioned as Schottky contacts.

16. Integrated circuit according to claim 15, wherein a metal contact of the Schottky contact of the first non-linear element covers the source terminal of the field effect transistor of the first channel type and covers the well-shaped semiconductor zone of a first conductivity type and forms a first double contact; and wherein a metal contact of the Schottky contact of the second non-linear element covers a first terminal of the field effect transistor of the second channel type and covers the doped semiconductor substrate of a second channel type and forms a second double contact.

17. Integrated circuit according to claim 2, wherein the non-linear elements are realized by MOS transistors that are connected as diode elements.

18. Integrated circuit according to claim 17, wherein a first MOS transistor of a first channel type is arranged within an inserted, further well-shaped semiconductor zone of a second conductivity type; wherein a first terminal of the first MOS transistor is connected to a gate of the first MOS transistor is connected to the doped semiconductor substrate of a first conductivity type; wherein a second MOs transistor of a second channel type is arranged within the doped semiconductor substrate of a first conductivity type; wherein a first terminal of the second MOS transistor is connected to a gate of the second MOS transistor and a second terminal of the second MOS transistor is connected to the inserted, well-shaped semiconductor zone of a second conductivity type.

19. Integrated circuit according to claim 9, wherein the non-linear elements are fashioned as barrier layer diodes.

20. Integrated circuit according to claim 9, wherein the first terminals of the non-linear elements are connected via ohmic contacts to grounded potential.

21. Integrated circuit according to claim 9, wherein the second terminals of the non-linear elements are connected to a more highly doped semiconductor region of the same conductivity type as the polycrystalline silicon.

22. Integrated circuit according to claim 1, wherein the first terminal of the first non-linear element is replaced by a terminal at negative substrate potential.

23. Integrated circuit according to claim 1, wherein the first terminal of the second non-linear element is replaced by a terminal having more positive potential than the supply voltage.

24. Integrated circuit according to claim 2, wherein the first terminal of the first non-linear element is replaced by a terminal at negative substrate potential.

25. Integrated circuit according to claim 2, wherein the first terminal of the second non-linear element is replaced by a terminal having more positive potential than the supply voltage.

26. Integrated circuit according to claim 8, wherein the first terminals of the non-linear elements are connected via ohmic contacts to a more highly doped semiconductor region of the conductivity type opposite that of the polycrystalline silicon.

27. Integrated circuit according to claim 8, wherein the second terminals of the barrier layer diodes are connected via a diffusion region to the supply voltage upon formation of the barrier layer diodes.

28. Integrated circuit according to claim 9, wherein the first terminals of the non-linear elements are connected via ohmic contacts to a more highly doped semiconductor region of the conductivity type opposite that of the polycrystalline silicon.

29. Integrated circuit according to claim 9, wherein the second terminals of the non-linear elements are connected via a diffusion region to the supply potential upon formation of the barrier layer diodes.

* * * * *